United States Patent
Jee et al.

(10) Patent No.: US 12,222,401 B2
(45) Date of Patent: Feb. 11, 2025

(54) METHOD OF DIAGNOSING DEGRADATION OF ELECTRODE ACTIVE MATERIAL FOR LITHIUM SECONDARY BATTERY

(71) Applicant: LG Energy Solution, Ltd., Seoul (KR)

(72) Inventors: Su Won Jee, Daejeon (KR); Hyo Jung Yoon, Daejeon (KR); Young Deok Kim, Daejeon (KR); Ji Yeon Kim, Daejeon (KR); Dae Soo Kim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 316 days.

(21) Appl. No.: 17/774,666

(22) PCT Filed: Jan. 12, 2021

(86) PCT No.: PCT/KR2021/000411
§ 371 (c)(1),
(2) Date: May 5, 2022

(87) PCT Pub. No.: WO2021/149960
PCT Pub. Date: Jul. 29, 2021

(65) Prior Publication Data
US 2022/0397613 A1    Dec. 15, 2022

(30) Foreign Application Priority Data
Jan. 20, 2020    (KR) .................. 10-2020-0007495

(51) Int. Cl.
*G01R 31/392*    (2019.01)
*G01R 31/36*    (2020.01)
(Continued)

(52) U.S. Cl.
CPC ....... *G01R 31/392* (2019.01); *G01R 31/3646* (2019.01); *G01R 31/3865* (2019.01);
(Continued)

(58) Field of Classification Search
CPC .............. G01R 31/392; G01R 31/3646; G01R 31/3865; G01R 31/378; G01R 31/3648;
(Continued)

(56) References Cited

U.S. PATENT DOCUMENTS 6,706,448 B1 * 3/2004 Gole ...................... H01M 4/40
                                                        429/231.95
8,133,614 B1 * 3/2012 Gan ....................... H01M 4/54
                                                        429/231.5
(Continued)

FOREIGN PATENT DOCUMENTS

JP    4734684 B2    7/2011
JP    5062295 B2    10/2012
(Continued)

OTHER PUBLICATIONS

Jing Xu et al., "Understanding the Degradation Mechanism of Lithium Nickel Oxide Cathodes for Li-Ion Batteries", ACS Applied Materials & Interfaces, (Nov. 2016), 8, 46, pp. 31677-31683.
(Continued)

*Primary Examiner* — Suman K Nath
(74) *Attorney, Agent, or Firm* — Lerner David LLP

(57) ABSTRACT

A method of diagnosing degradation of an electrode active material for a secondary battery including obtaining a first differential curve (dQ/dV) by differentiating an initial charge/discharge curve obtained by performing first charging and first discharging of the lithium secondary battery in a voltage range of 2.5 V to 4.2 V, and obtaining a second differential curve (dQ/dV) by differentiating a charge/discharge curve obtained by performing second charging and second discharging of the lithium secondary battery in a voltage range of 2.5 V to 4.2 V, and diagnosing whether a beta phase of the positive electrode active material has been (Continued)

formed by comparing maximum discharge peak values of the first differential curve and the second differential curve.

12 Claims, 2 Drawing Sheets

(51) Int. Cl.

| | | |
|---|---|---|
| *G01R 31/385* | (2019.01) | |
| *H01M 4/38* | (2006.01) | |
| *H01M 4/485* | (2010.01) | |
| *H01M 4/505* | (2010.01) | |
| *H01M 4/525* | (2010.01) | |
| *H01M 10/052* | (2010.01) | |
| *H01M 10/44* | (2006.01) | |
| *H01M 4/02* | (2006.01) | |

(52) U.S. Cl.
CPC ........... *H01M 4/386* (2013.01); *H01M 4/485* (2013.01); *H01M 4/505* (2013.01); *H01M 4/525* (2013.01); *H01M 10/052* (2013.01); *H01M 10/446* (2013.01); *H01M 2004/027* (2013.01); *H01M 2004/028* (2013.01)

(58) Field of Classification Search
CPC ...... H01M 4/386; H01M 4/485; H01M 4/505; H01M 4/525; H01M 10/052; H01M 10/446; H01M 10/0525; H01M 10/058; H01M 10/42; H01M 10/4285; H01M 10/44; H01M 10/48; H01M 2004/027; H01M 2004/028; Y02E 60/10
See application file for complete search history.

(56) References Cited

U.S. PATENT DOCUMENTS

| | | |
|---|---|---|
| 2011/0012604 A1 | 1/2011 | Tsujiko et al. |
| 2013/0335009 A1 | 12/2013 | Katsumata et al. |
| 2016/0211517 A1 | 7/2016 | Beck et al. |
| 2016/0259011 A1 | 9/2016 | Joe |
| 2017/0176543 A1 | 6/2017 | Lee et al. |
| 2019/0148725 A1 | 5/2019 | Choi et al. |
| 2021/0046844 A1 | 2/2021 | Bae et al. |

FOREIGN PATENT DOCUMENTS

| | | | |
|---|---|---|---|
| JP | 2013211111 | A | 10/2013 |
| JP | 2014002055 | A | 1/2014 |
| JP | 2014139897 | A | 7/2014 |
| JP | 2018078023 | A | 5/2018 |
| JP | 2018107053 | A | 7/2018 |
| JP | 2018147635 | A | 9/2018 |
| JP | 2019-091692 | A | 6/2019 |
| KR | 101708885 | B1 | 2/2017 |
| KR | 101894131 | B1 | 8/2018 |
| KR | 2019-0038326 | A | 4/2019 |
| KR | 20190118529 | A | 10/2019 |

OTHER PUBLICATIONS

International Search Report for PCT/KR2021/000411 dated Apr. 15, 2021. 3 pgs.

Schweidler Simon et al: "Investigation into Mechanical Degradation and Fatigue of High-Ni NCM Cathode Material: A Long-Term Cycling Study of Full Cells", ACS Applied Energy Materials, vol. 2, No. 10, Oct. 28, 2019 (Oct. 28, 2019), pp. 7375-7384, XP093041088, ISSN: 2574-0962, DOI: 10.1021/acsaem.9b01354 *p. 7376; figure 1*.

Extended European Search Report for Application No. 21744539.4 dated May 3, 2023. 5 pgs.

Hoon-Hee Ryu et al., Capacity Fading of Ni-Rich Li[NixCoyMn1-x-y]O2 (0.6?x?0.95) Cathodes for High-Energy-Density Lithium-Ion Batteries: Bulk or Surface Degradation?, Chem. Mater. 2018, vol. 30, pp. 1155-1163, Chem. Mater. Jan. 2018, vol. 30, pp. 1155-1163.

* cited by examiner

METHOD OF DIAGNOSING DEGRADATION OF ELECTRODE ACTIVE MATERIAL FOR LITHIUM SECONDARY BATTERY

CROSS-REFERENCE TO RELATED APPLICATIONS

This application is a national phase entry under 35 U.S.C. § 371 of International Application No. PCT/KR2021/000411, filed on Jan. 12, 2021, which claims priority from Korean Patent Application No. 10-2020-0007495, filed on Jan. 20, 2020, the disclosures of which are incorporated by reference herein.

TECHNICAL FIELD

The present invention relates to a method of diagnosing degradation of an electrode active material for a lithium secondary battery.

BACKGROUND ART

Demand for secondary batteries as an energy source has been significantly increased as technology development and demand with respect to mobile devices have increased. Among these secondary batteries, lithium secondary batteries having high energy density, high voltage, long cycle life, and low self-discharging rate have been commercialized and widely used. Particularly in recent years, with the rapid popularization of electric vehicles, development of high-energy batteries, which may be used as power sources for medium and large sized devices, is becoming important.

Lithium transition metal composite oxides have been used as a positive electrode active material of the lithium secondary battery, and, among these oxides, a lithium cobalt composite metal oxide, such as $LiCoO_2$, having a high operating voltage and excellent capacity characteristics has been mainly used. However, the $LiCoO_2$ has very poor thermal properties due to an unstable crystal structure caused by delithiation. Also, since the $LiCoO_2$ is expensive, there is a limitation in using a large amount of the $LiCoO_2$ as a power source for applications such as electric vehicles.

Lithium manganese composite metal oxides ($LiMnO_2$ or $LiMn_2O_4$), lithium iron phosphate compounds ($LiFePO_4$, etc.), or lithium nickel composite metal oxides ($LiNiO_2$, etc.) have been developed as materials for replacing the $LiCoO_2$. Among these materials, research and development of the lithium nickel composite metal oxides, in which a large capacity battery may be easily achieved due to a high reversible capacity of about 200 mAh/g, have been more actively conducted. However, the $LiNiO_2$ has limitations in that the $LiNiO_2$ has poorer thermal stability than the $LiCoO_2$ and, when an internal short circuit occurs in a charged state due to an external pressure, the positive electrode active material itself is decomposed to cause rupture and ignition of the battery. Accordingly, as a method to improve low thermal stability while maintaining the excellent reversible capacity of the $LiNiO_2$, a lithium transition metal oxide, in which a portion of nickel (Ni) is substituted with cobalt (Co), manganese (Mn), or aluminum (Al), has been developed.

However, with respect to the lithium transition metal oxide in which the portion of the Ni is substituted with Co, Mn, or Al, in a case in which an amount of the nickel is increased to 60 mol % or more in order to achieve high energy by increasing capacity characteristics, there has been a problem in that a new phase is formed as lithium present in the positive electrode active material is deintercalated at a high potential and structural stability of the positive electrode active material is reduced due to such a phase transition.

Typically, in order to diagnose a change in the structural stability of the positive electrode active material due to the phase transition, a method of disassembling a battery after charge and discharge and observing the disassembled battery has been used. In this case, it took long time and high cost to diagnose the phase transition of the positive electrode active material.

Thus, there is a need for a diagnostic method capable of diagnosing degradation of a battery due to phase transition of a positive electrode active material structure without disassembling the secondary battery.

DISCLOSURE OF THE INVENTION

Technical Problem

An aspect of the present invention provides a method of diagnosing degradation of an electrode active material for a secondary battery which may diagnose the degradation of a positive electrode active material due to phase transition without disassembling the battery after charge and discharge.

Technical Solution

According to an aspect of the present invention, there is provided a method of diagnosing degradation of an electrode active material for a secondary battery which includes: preparing a lithium secondary battery which includes a positive electrode including a positive electrode active material of a lithium transition metal oxide containing nickel (Ni) in an amount of 60 mol % or more based on a total number of moles of transition metals except lithium, and a negative electrode facing the positive electrode; obtaining a first differential curve (dQ/dV) by differentiating an initial charge/discharge curve obtained by performing first charging and first discharging of the lithium secondary battery in a voltage range of 2.5 V to 4.2 V; and obtaining a second differential curve (dQ/dV) by differentiating a charge/discharge curve obtained by performing second charging and second discharging of the lithium secondary battery in a voltage range of 2.5 V to 4.2 V, wherein, in comparison to a maximum discharge peak value of the first differential curve, when a spaced-apart peak, in which a maximum discharge peak value of the second differential curve is spaced apart by 0.01 V to 0.1 V, occurs at 4 V or more, it is diagnosed that a beta phase of the positive electrode active material has been formed.

Advantageous Effects

According to the present invention, since a differential capacity curve is measured without disassembling a battery when diagnosing degradation of a positive electrode, occurrence of phase transition of a positive electrode active material structure may be predicted by using the same, and the resultant degradation of the positive electrode and the secondary battery may be predicted.

MODE FOR CARRYING OUT THE INVENTION

Figure 1:
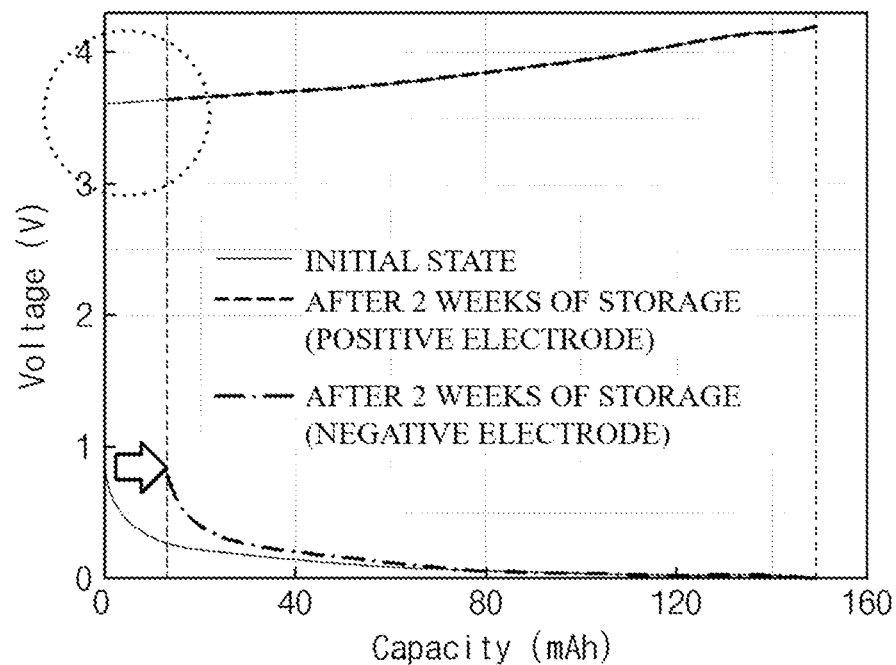
FIG. 1 illustrates charge and discharge curves of a coin cell including a positive electrode and a negative electrode of Example 1, respectively.

Hereinafter, the present invention will be described in more detail.

In the present specification, with respect to a "beta phase" of the positive electrode active material, a phase of a lithium transition metal oxide is changed as lithium (Li) present in the lithium transition metal oxide is deintercalated due to the tendency that nickel contained in the lithium transition metal oxide with a high nickel content is maintained as $Ni^{2+}$ according to charge and discharge of a lithium secondary battery, wherein, in this case, a phase immediately after preparation of the positive electrode active material is referred to as an "alpha phase", and a phase of the positive electrode active material, in which phase transition has occurred after the charge and discharge, is referred to as a "beta phase".

Method of Diagnosing Degradation of Electrode Active Material for Lithium Secondary Battery A method of diagnosing degradation of an electrode active material for a secondary battery according to the present invention includes: preparing a lithium secondary battery which includes a positive electrode including a positive electrode active material of a lithium transition metal oxide containing nickel (Ni) in an amount of 60 mol % or more based on a total number of moles of transition metals except lithium, and a negative electrode facing the positive electrode; obtaining a first differential curve (dQ/dV) by differentiating an initial charge/discharge curve obtained by performing first charging and first discharging of the lithium secondary battery in a voltage range of 2.5 V to 4.2 V; and obtaining a second differential curve (dQ/dV) by differentiating a charge/discharge curve obtained by performing second charging and second discharging of the lithium secondary battery in a voltage range of 2.5 V to 4.2 V, wherein, in comparison to a maximum discharge peak value of the first differential curve, when a spaced-apart peak, in which a maximum discharge peak value of the second differential curve is spaced apart by 0.01 V to 0.1 V, occurs at 4 V or more, it is diagnosed that a beta phase of the positive electrode active material has been formed.

Hereinafter, the method will be described in more detail.

First, with respect to a lithium secondary battery according to the present invention, a secondary battery, which includes a positive electrode including a positive electrode active material of a lithium transition metal oxide containing Ni in an amount of 60 mol % or more based on a total number of moles of transition metals, a negative electrode facing the positive electrode, a separator disposed between the positive electrode and the negative electrode, and an electrolyte, is prepared.

The positive electrode according to the present invention may be prepared by coating a composition for forming a positive electrode, which includes the above-described positive electrode active material, a binder, a conductive agent, and a solvent, on a positive electrode collector.

For example, in order to achieve high energy density of the secondary battery, the positive electrode may contain 60 mol % or more of nickel based on a total number of moles of transition metals except lithium, and, preferably, the positive electrode active material may be represented by the following Formula 1.

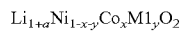

$$Li_{1+a}Ni_{1-x-y}Co_xM1_yO_2 \qquad \text{[Formula 1]}$$

In Formula 1, 0≤a≤0.3, 0≤x≤0.2, 0≤y≤0.2, and 0≤x+y≤0.4.

Specifically, M1 in Formula 1 is an element substituted at a transition metal site in an oxide represented by Formula 1, and M1 may include at least one selected from manganese (Mn) and aluminum (Al).

1+a represents a molar ratio of lithium in the oxide represented by Formula 1, wherein a may satisfy 0≤a≤0.3 and preferably 0≤a≤0.2.

x represents a molar ratio of cobalt (Co) in the oxide represented by Formula 1, wherein x may satisfy 0≤x≤0.2 and preferably 0<x≤0.15.

y represents a molar ratio of M1 in the oxide represented by Formula 1, wherein y may satisfy 0≤y≤0.2, and preferably 0<y≤0.15.

1-x-y represents a molar ratio of Ni in the oxide represented by Formula 1, wherein 1-x-y may satisfy 0.6≤1-x-y≤1.0, and preferably 0.8≤1-x-y<1.0.

In a case in which nickel is contained in the lithium transition metal oxide in an amount of 60 mol % or more, particularly 80 mol % or more based on the total number of moles of the transition metals except lithium as in the present invention, high capacity of the secondary battery may be achieved when the lithium transition metal oxide is used, but a phase of the lithium transition metal oxide may be changed as lithium (Li) present in the lithium transition metal oxide is deintercalated due to the tendency that the nickel in the lithium transition metal oxide is maintained as $Ni^{2+}$. In a case in which phase transition of the lithium transition metal oxide occurs, structural stability may be reduced, and, when the lithium transition metal oxide is used in the battery, electrochemical properties of the battery may be deteriorated due to degradation of the positive electrode according to the progress of charge and discharge.

In this case, the positive electrode active material may be included in an amount of 80 parts by weight to 99 parts by weight, for example, 85 parts by weight to 98 parts by weight based on a total weight of a solid content of the composition for forming a positive electrode. When the positive electrode active material is included in an amount within the above-described range, excellent capacity characteristics may be obtained.

The positive electrode collector is not particularly limited as long as it has conductivity without causing adverse chemical changes in the battery, and, for example, stainless steel, aluminum, nickel, titanium, fired carbon, or aluminum or stainless steel that is surface-treated with one of carbon, nickel, titanium, silver, or the like may be used.

The binder is a component that assists in the binding between the active material and the conductive agent and in the binding with the current collector, wherein the binder may be typically added in an amount of 1 wt % to 30 wt % based on the total weight of the solid content of the composition for forming a positive electrode. Examples of the binder may be polyvinylidene fluoride, polyvinyl alcohol, carboxymethyl cellulose (CMC), starch, hydroxypropyl cellulose, regenerated cellulose, polyvinylpyrrolidone, polytetrafluoroethylene, polyethylene, polypropylene, an ethylene-propylene-diene terpolymer (EPDM), a sulfonated EPDM, a styrene-butadiene rubber, a fluorine rubber, or various copolymers thereof.

The conductive agent may be typically added in an amount of 1 wt % to 30 wt % based on the total weight of the solid content of the composition for forming a positive electrode.

The conductive agent is not particularly limited as long as it has conductivity without causing adverse chemical changes in the battery, and, for example, a conductive material, such as: a carbon-based material such as carbon black, acetylene black, Ketjen black, channel black, furnace black, lamp black, and thermal black; conductive fibers such as carbon fibers or metal fibers; metal powder such as fluorocarbon powder, aluminum powder, and nickel powder; conductive whiskers such as zinc oxide whiskers and potassium titanate whiskers; conductive metal oxide such as titanium oxide; or polyphenylene derivatives, may be used. Specific examples of a commercial conductive agent may be acetylene black-based products (Chevron Chemical Company, Denka black (Denka Singapore Private Limited), or Gulf Oil Company product), Ketjen black, ethylene carbonate (EC)-based products (Armak Company product), Vulcan XC-72 (Cabot Company product), and Super P (Timcal Graphite & Carbon product).

In addition, a positive electrode active material layer may selectively further include a dispersant, if necessary.

The dispersant may be used without particular limitation as long as it is used as a dispersant of the positive electrode, and, for example, an aqueous dispersant or an organic dispersant may be selectively used as needed. Preferably, the dispersant may include a cellulose-based compound, polyalkylene oxide, polyvinyl alcohol, polyvinylpyrrolidone, polyvinyl acetal, polyvinyl ether, polyvinyl sulfonic acid, polyvinyl chloride (PVC), polyvinylidene fluoride, chitosans, starch, amylose, polyacrylamide, poly-N-isopropylacrylamide, poly-N,N-dimethylacrylamide, polyethyleneimine, polyoxyethylene, poly(2-methoxyethoxyethylene), poly(acrylamide-co-diallyldimethylammonium chloride), an acrylonitrile/butadiene/styrene (ABS) polymer, an acrylonitrile/styrene/acrylic ester (ASA) polymer, a mixture of an acrylonitrile/styrene/acrylic ester (ASA) polymer and propylene carbonate, a styrene/acrylonitrile (SAN) copolymer, a methyl methacrylate/acrylonitrile/butadiene/styrene (MABS) polymer, a styrene butadiene rubber, a nitrile butadiene rubber, or a fluorine rubber, and any one thereof or a mixture of two or more thereof may be used. A hydrogenated nitrile butadiene rubber (H-NBR) may be used. In a case in which the positive electrode active material layer further includes the dispersant, dispersibility of components of the positive electrode active material layer, particularly the conductive material may be increased, but the present invention is not limited thereto.

Also, the solvent may be a solvent normally used in the art. The solvent may include dimethyl sulfoxide (DMSO), isopropyl alcohol, N-methylpyrrolidone (NMP), acetone, or water, and any one thereof or a mixture of two or more thereof may be used. An amount of the solvent used may be sufficient if the solvent may dissolve or disperse the positive electrode active material, the conductive agent, and the binder in consideration of a coating thickness of a slurry and manufacturing yield, and may allow to have a viscosity that may provide excellent thickness uniformity during the subsequent coating for the preparation of the positive electrode.

The negative electrode according to the present invention may be prepared by coating a composition for forming a negative electrode, which includes a negative electrode active material, a binder, a conductive agent, and a solvent, on a negative electrode collector. Also, the composition for forming a negative electrode may selectively further include a dispersant, if necessary.

A compound capable of reversibly intercalating and deintercalating lithium may be used as the negative electrode active material. Preferably, the negative electrode may include a silicon-based negative electrode active material exhibiting high capacity characteristics.

Also, the negative electrode active material may further include a carbon-based negative electrode active material as well as the silicon-based negative electrode active material. For example, in a case in which the negative electrode active material includes the silicon-based negative electrode active material and the carbon-based negative electrode active material, irreversible capacity may be reduced in comparison to a case where only the silicon-based negative electrode active material is included, while having high capacity characteristics.

The silicon-based negative electrode active material and the carbon-based negative electrode active material may be used by being mixed in a weight ratio of 1:99 to 20:80.

The negative electrode collector is not particularly limited as long as it has high conductivity without causing adverse chemical changes in the battery, and, for example, copper, stainless steel, aluminum, nickel, titanium, fired carbon, copper or stainless steel that is surface-treated with one of carbon, nickel, titanium, silver, or the like, and an aluminum-cadmium alloy may be used. Also, the negative electrode collector may typically have a thickness of 3 μm to 500 μm, and, similar to the positive electrode collector, microscopic irregularities may be formed on the surface of the collector to improve the adhesion of a negative electrode active material. The negative electrode collector, for example, may be used in various shapes such as that of a film, a sheet, a foil, a net, a porous body, a foam body, a non-woven fabric body, and the like.

The conductive agent, binder, solvent, or dispersant included in the composition for forming a negative electrode may be used without particular limitation as long as it may be typically used in a composition for forming an electrode, and, for example, the conductive material, binder, solvent, or dispersant described in the above-described composition for forming a positive electrode may be used.

In the lithium secondary battery, the separator separates the negative electrode and the positive electrode and provides a movement path of lithium ions, wherein any separator may be used as the separator without particular limitation as long as it is typically used in a lithium secondary battery, and particularly, a separator having high moisture-retention ability for an electrolyte as well as low resistance to the transfer of electrolyte ions may be used. Specifically, a porous polymer film, for example, a porous polymer film prepared from a polyolefin-based polymer, such as an ethylene homopolymer, a propylene homopolymer, an ethylene/butene copolymer, an ethylene/hexene copolymer, and an ethylene/methacrylate copolymer, or a laminated structure having two or more layers thereof may be used. Also, a typical porous nonwoven fabric, for example, a nonwoven fabric formed of high melting point glass fibers or polyethylene terephthalate fibers may be used. Furthermore, a coated separator including a ceramic component or a polymer material may be used to secure heat resistance or mechanical strength, and the separator having a single layer or multilayer structure may be selectively used.

Also, the electrolyte used in the present invention may include an organic liquid electrolyte, an inorganic liquid electrolyte, a solid polymer electrolyte, a gel-type polymer electrolyte, a solid inorganic electrolyte, or a molten-type inorganic electrolyte which may be used in the preparation of the lithium secondary battery, but the present invention is not limited thereto.

Specifically, the electrolyte may include an organic solvent and a lithium salt.

Any organic solvent may be used as the organic solvent without particular limitation so long as it may function as a medium through which ions involved in an electrochemical reaction of the battery may move. Specifically, an ester-based solvent such as methyl acetate, ethyl acetate, γ-butyrolactone, and ε-caprolactone; an ether-based solvent such as dibutyl ether or tetrahydrofuran; a ketone-based solvent such as cyclohexanone; an aromatic hydrocarbon-based solvent such as benzene and fluorobenzene; or a carbonate-based solvent such as dimethyl carbonate (DMC), diethyl carbonate (DEC), methylethyl carbonate (MEC), ethylmethyl carbonate (EMC), ethylene carbonate (EC), and propylene carbonate (PC); an alcohol-based solvent such as ethyl alcohol and isopropyl alcohol; nitriles such as R-CN (where R is a linear, branched, or cyclic C2-C20 hydrocarbon group and may include a double-bond aromatic ring or ether bond); amides such as dimethylformamide; dioxolanes such as 1,3-dioxolane; or sulfolanes may be used as the organic solvent. Among these solvents, the carbonate-based solvent may be used, and, for example, a mixture of a cyclic carbonate (e.g., ethylene carbonate or propylene carbonate) having high ionic conductivity and high dielectric constant, which may increase charge/discharge performance of the battery, and a low-viscosity linear carbonate-based compound (e.g., ethylmethyl carbonate, dimethyl carbonate, or diethyl carbonate) may be used. In this case, performance of the electrolyte solution may be excellent when the cyclic carbonate and the chain carbonate are mixed in a volume ratio of about 1:1 to about 1:9.

The lithium salt may be used without particular limitation as long as it is a compound capable of providing lithium ions used in the lithium secondary battery. Specifically, $LiPF_6$, $LiClO_4$, $LiAsF_6$, $LiBF_4$, $LiSbF_6$, $LiAlO_4$, $LiAlCl_4$, $LiCF_3SO_3$, $LiC_4F_9SO_3$, $LiN(C_2F_5SO_3)_2$, $LiN(C_2F_5SO_2)_2$, $LiN(CF_3SO_2)_2$, LiCl, LiI, or $LiB(C_2O_4)_2$ may be used as the lithium salt. The lithium salt may be used in a concentration range of 0.1 M to 2.0 M. In a case in which the concentration of the lithium salt is included within the above range, since the electrolyte may have appropriate conductivity and viscosity, excellent performance of the electrolyte may be obtained and lithium ions may effectively move.

In order to improve life characteristics of the battery, suppress a reduction in battery capacity, and improve discharge capacity of the battery, at least one additive, for example, a halo-alkylene carbonate-based compound such as difluoroethylene carbonate, pyridine, triethylphosphite, triethanolamine, cyclic ether, ethylenediamine, n-glyme, hexaphosphoric triamide, a nitrobenzene derivative, sulfur, a quinone imine dye, N-substituted oxazolidinone, N,N-substituted imidazolidine, ethylene glycol dialkyl ether, an ammonium salt, pyrrole, 2-methoxy ethanol, or aluminum trichloride, may be further added to the electrolyte in addition to the electrolyte components. In this case, the additive may be included in an amount of 0.1 part by weight to 5 parts by weight based on 100 parts by weight of a total weight of the electrolyte.

Subsequently, a first differential curve (dQ/dV) is obtained by differentiating an initial charge/discharge curve which is obtained by performing first charging and first discharging of the above-prepared lithium secondary battery in a voltage range of 2.5 V to 4.2 V (first step).

In this case, the first charging and first discharging denote first charging and first discharging performed immediately after the preparation of the lithium secondary battery.

In the present invention, charging and discharging of the lithium secondary battery may be performed at a low rate of 0.01 C to 0.1 C, for example, 0.02 C to 0.05 C. When the charging and discharging are performed at a low rate in the above-described range, an effect of excluding a resistance element of a profile may be achieved.

A differential capacity curve (dq/dV curve) may be obtained by differentiating the initial charge/discharge curve obtained above.

Subsequently, a second differential curve (dQ/dV) is obtained by differentiating a charge/discharge curve which is obtained by performing second charging and second discharging of the lithium secondary battery in a voltage range of 2.5 V to 4.2 V (second step).

In this case, the second charging and second discharging denote charging and discharging after charging and discharging of the secondary battery subjected to the first charging and first discharging are repeated 1 to 10 times, for example, 1 to 5 times.

For example, charging and discharging of the secondary battery subjected to the first charging and first discharging are repeated 1 to 10 times, and thereafter, a second differential curve (dQ/dV) may be obtained by differentiating a charge/discharge curve which is obtained by again performing charging and discharging of the secondary battery subjected to the repeated charging and discharging in a voltage range of 2.5 V to 4.2 V.

Also, the second charging and second discharging denote charging and discharging after storing the secondary battery subjected to the first charging and first discharging at 60° C. for 2 weeks to 10 weeks.

For example, the secondary battery subjected to the first charging and first discharging is stored at a high temperature, and a second differential curve (dQ/dV) may be obtained by differentiating a charge/discharge curve which is obtained by again performing charging and discharging of the secondary battery after the storage in a voltage range of 2.5 V to 4.2 V.

According to the method of diagnosing the degradation of the electrode of the present invention, in a case in which charging and discharging of the lithium secondary battery are repeatedly performed within an operating voltage range of the battery, or the lithium secondary battery is stored for a long time after initial charge and discharge of the lithium secondary battery, a differential curve peak in the second differential capacity curve obtained after the repeated charging and discharging or storage may be spaced apart at about 4 V or more in comparison to the first differential capacity curve obtained after preparing the lithium secondary battery and performing the initial charge and discharge.

For example, in comparison to a maximum discharge peak value of the first differential capacity curve, a spaced-apart peak, in which a maximum discharge peak value of the second differential curve is spaced apart by 0.01 V to 0.1 V, may occur at 4 V or more. When a peak spaced apart by less than the above-described range occurs, this means that the degradation of the positive electrode active material hardly occurs.

The spaced-apart of the differential curve peaks is due to a shift of a negative electrode profile caused by a loss of reversible capacity of lithium by repeatedly charging and discharging the secondary battery.

For example, when the lithium secondary battery is repeatedly charged and discharged in the operating voltage range of the battery, that is, a voltage range of 2.5 V to 4.2 V, a solid electrolyte interphase (SEI) is formed on a surface of the negative electrode while the electrolyte is decomposed. Accordingly, an irreversible capacity loss occurs, and, as a result, the negative electrode profile may shift due to a loss of available lithium.

Also, the above-described spaced-apart of the differential curve peaks is due to the shift of the negative electrode profile caused by the loss of the reversible capacity of lithium by the storage of the secondary battery subjected to the initial charge and discharge.

For example, in a case in which the secondary battery subjected to the initial charge and discharge is stored at 60° C. for 2 weeks to 10 weeks, an irreversible capacity loss occurs due to a reduction side reaction and the degradation of the electrode active material, and, accordingly, the negative electrode profile may shift due to the loss of available lithium.

Since a potential of the positive electrode capable of reacting with the negative electrode also increases due to the shift of the negative electrode, that is, a change in operating voltage of the negative electrode, a lower end potential of the positive electrode may not be used.

Thus, as illustrated in FIG. 1, since a positive electrode profile also shifts due to the shift of the above-described negative electrode profile, the positive electrode profile is shifted in a direction in which a lower end voltage is not used.

Thus, in a case in which the lower end potential of the positive electrode is not used, since the reaction occurs relatively only at an upper potential of the positive electrode, complete contraction and expansion of the positive electrode active material may not occur, and thus, it may be predicted that a structure of the positive electrode active material will be further changed.

This change in the structure of the positive electrode active material forms a beta phase in the positive electrode active material.

Specifically, in a case in which the charge/discharge curve, which is shifted in the direction in which the lower end voltage is not used as described above, is differentiated, a spaced-apart differential peak occurs at 4 V or more due to the shift of the positive electrode and negative electrode profiles.

In contrast, when a spaced-apart peak occurs at 4 V or more in the second differential curve in comparison to the first differential curve obtained during the initial charge and discharge, even if the structure of the positive electrode active material is not observed by disassembling the battery after charging and discharging of the secondary battery, it may be considered that the shift of the negative electrode profile due to a decrease in amount of available lithium, the resulting formation of the beta phase of the positive electrode active material, and the resulting degradation of the positive electrode have occurred.

Hereinafter, the present invention will be described in detail, according to specific examples.

Example 1

$LiNi_{0.8}Co_{0.1}Mn_{0.1}O_2$ as a positive electrode active material, a carbon black conductive agent, a dispersant, and a polyvinylidene fluoride binder were mixed in a weight ratio of 97.5:1:0.15:1.35, and the mixture was mixed in an N-methylpyrrolidone solvent to prepare a composition for forming a positive electrode. An aluminum foil was coated with the composition for forming a positive electrode, dried, and then roll-pressed to prepare a positive electrode.

A mixture, in which graphite and SiO were mixed in a weight ratio of 90:10, used as a negative electrode active material, carbon black, a carbon nanotube conductive agent, and a polyvinylidene fluoride binder were mixed in a weight ratio of 96:0.5:0.1:3.4, and the mixture was added to an N-methylpyrrolidone solvent to prepare a composition for forming a negative electrode. A 6 μm thick copper current collector was coated with the composition for forming a negative electrode, dried, and then roll-pressed to prepare a negative electrode.

After the above-prepared positive electrode and negative electrode were stacked with a safety reinforced separator (SRS) to prepare an electrode assembly, the electrode assembly was put in a battery case, and an electrolyte solution, in which a 1.2 M $LiPF_6$ electrolyte salt was dissolved in a solvent in which ethylene carbonate (EC):propylene carbonate (PC):ethylmethyl carbonate (EMC) were mixed in a volume ratio of 25:5:70, was injected thereinto to prepare a lithium secondary battery.

The lithium secondary battery prepared as described above was first charged at a constant current of 0.05 C to 4.2 V and cut-off charged at 0.025 C. Thereafter, the lithium secondary battery was first discharged at a constant current of 0.05 C to 2.5 V. A first differential capacity curve (dq/dV) was obtained by differentiating an initial charge/discharge curve which was measured after the charge and discharge.

Subsequently, the secondary battery after the initial charge and discharge was stored at 60° C. for 8 weeks.

Figure 2:
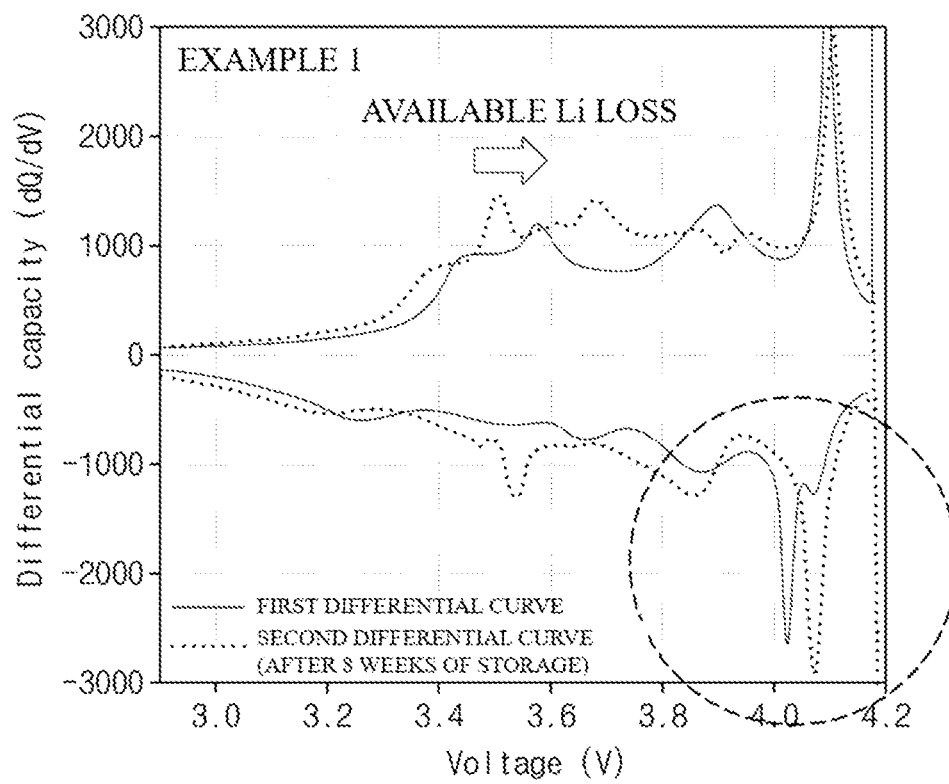
FIG. 2 is differential capacity curves of a secondary battery prepared in Example 1.

After 8 weeks of storage, the secondary battery was second charged at a constant current of 0.05 C to 4.2 V and cut-off charged at 0.025 C and was second discharged at a constant current of 0.05 C to 2.5 V to obtain a charge/discharge curve, a second differential capacity curve was obtained by differentiating the charge/discharge curve, and the second differential capacity curve is illustrated in FIG. 2.

As illustrated in FIG. 2, since the secondary battery including the negative electrode of Example 1 contained silicon oxide having a relatively large irreversible capacity as the negative electrode active material, a loss of available lithium was large during charge and discharge, and thus, it may be confirmed that a spacing of spaced-apart peaks at 4.0 V or more was large at about 0.05 V.

Example 2

Figure 3:
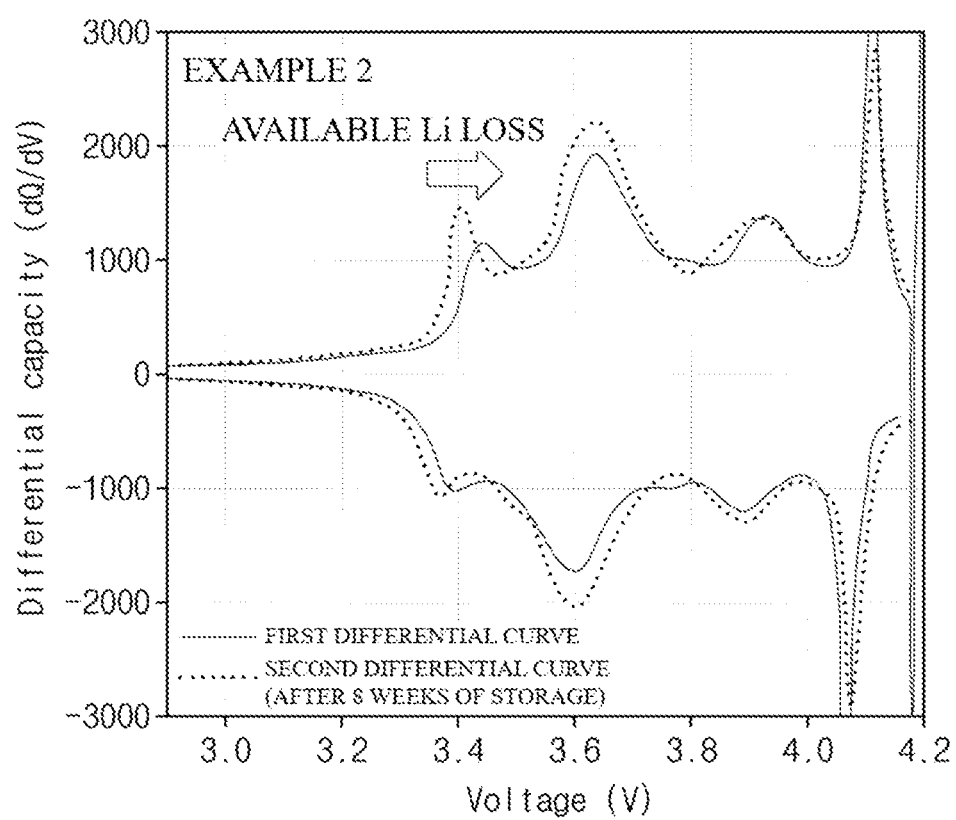
FIG. 3 is differential capacity curves of a secondary battery prepared in Example 2.

A lithium secondary battery was prepared in the same manner as in Example 1 except that only graphite was used as the negative electrode active material, first and second differential capacity curves were obtained, and these are illustrated in FIG. 3.

Since the secondary battery including the negative electrode of Example 2 described above did not contain a material having a large irreversible capacity as a negative electrode material, the loss of available lithium was small even if charge and discharge were performed, and thus, it may be confirmed that spaced-apart peaks were observed at 4.0 V or more, but a spacing of the corresponding peaks was small at about 0.02 V.

The invention claimed is:

1. A method of diagnosing degradation by beta phase formation of an electrode active material for a secondary battery, comprising:
preparing a lithium secondary battery which includes a positive electrode including a positive electrode active material of a lithium transition metal oxide containing nickel (Ni) in an amount of 60 mol % or more based on a total number of moles of transition metals except lithium, and a negative electrode facing the positive electrode;
performing first charging and first discharging of the lithium secondary battery in a voltage range of 2.5 V to 4.2 V, measuring an initial charge/discharge curve of the lithium secondary battery, and then differentiating the initial charge/discharge curve to obtain a first differential curve (dQ/dV) of the lithium secondary battery;

performing second charging and second discharging of the lithium secondary battery in a voltage range of 2.5 V to 4.2 V, measuring a second charge/discharge curve of the lithium secondary battery, and then differentiating the second charge/discharge curve to obtain a second differential curve (dQ/dV) of the lithium secondary battery, and diagnosing that a beta phase of the positive electrode active material has been formed by determining when spaced-apart peaks are observed at 4.0 V or more with a maximum discharge peak value of the second differential curve at 4.0 V or more compared to a maximum discharge peak value of at 4.0 V or more of the first differential curve is spaced apart within a range of 0.01 V to 0.1 V.

2. The method of claim 1, wherein the second charging and the second discharging are charging and discharging after charging and discharging of the secondary battery subjected to the first charging and the first discharging are repeated 1 to 10 times.

3. The method of claim 2, wherein reversible capacity of lithium is reduced by the repeated charging and discharging of the secondary battery subjected to the first charging and the first discharging or after a storage of the secondary battery subjected to the first charging and the first discharging.

4. The method of claim 3, wherein an operating voltage of the negative electrode is changed by a reduction in reversible capacity of the lithium.

5. The method of claim 4, wherein the operating voltage of the negative electrode is increased by the reduction in the reversible capacity of the lithium.

6. The method of claim 4, wherein the operating voltage of the negative electrode is changed by the reduction in the reversible capacity of the lithium to increase a potential of the positive electrode.

7. The method of claim 6, wherein a structure of the positive electrode active material is changed by the increase in the potential of the positive electrode.

8. The method of claim 1, wherein the second charging and the second discharging are charging and discharging after storing the secondary battery subjected to the first charging and the first discharging at 60° C. for 2 weeks to 10 weeks.

9. The method of claim 8, wherein reversible capacity of lithium is reduced by a repeated charging and discharging of the secondary battery subjected to the first charging and the first discharging or the storage of the secondary battery subjected to the first charging and the first discharging.

10. The method of claim 1, wherein the positive electrode active material is represented by Formula 1:

$$Li_{1+a}Ni_{1-x-y}Co_xM1_yO_2 \qquad \text{[Formula 1]}$$

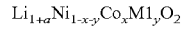

wherein, in Formula 1,

0≤a≤0.3, 0≤x≤0.2, 0≤y≤0.2, and 0≤x+y≤0.4, and

M1 is at least one selected from manganese (Mn) and aluminum (Al).

11. The method of claim 1, wherein the negative electrode comprises a silicon-based negative electrode active material.

12. The method of claim 1, wherein the amount of nickel (Ni) contained in the lithium transition metal oxide is from 80 mol % or more based on a total number of moles of transition metals except lithium.

* * * * *